US008835926B2

(12) United States Patent
Yoon et al.

(10) Patent No.: US 8,835,926 B2
(45) Date of Patent: Sep. 16, 2014

(54) ORGANIC LIGHT EMITTING DISPLAY DEVICE

(75) Inventors: Seok-Gyu Yoon, Yongin (KR); Jae-Heung Ha, Yongin (KR); Jong-Hyuk Lee, Yongin (KR); Young-Woo Song, Yongin (KR); Kyu-Hwan Hwang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 499 days.

(21) Appl. No.: 13/064,584

(22) Filed: Apr. 1, 2011

(65) Prior Publication Data

US 2011/0241014 A1 Oct. 6, 2011

(30) Foreign Application Priority Data

Apr. 2, 2010 (KR) .................. 10-2010-0030503

(51) Int. Cl.
*H01L 27/15* (2006.01)
*H01L 27/32* (2006.01)

(52) U.S. Cl.
CPC ..... *H01L 27/3276* (2013.01); *H01L 2251/5323* (2013.01)
USPC .......... 257/59; 257/40; 257/72; 257/E51.005; 257/E51.018; 438/149; 438/151; 438/155

(58) Field of Classification Search
USPC ............... 257/59, 72, E51.005, 40, E51.018; 438/149, 151, 155; 349/139, 140, 142; 313/503–505; 348/276; 345/76, 82
See application file for complete search history.

(56) References Cited

U.S. PATENT DOCUMENTS

| 5,976,978 | A  | * | 11/1999 | Salisbury ....................... 438/690 |
| 6,618,029 | B1 | * | 9/2003  | Ozawa .............................. 345/82 |
| 6,710,372 | B2 | * | 3/2004  | Kim .................................. 257/72 |
| 6,759,281 | B1 | * | 7/2004  | Kim et al. ...................... 438/149 |
| 7,288,420 | B1 | * | 10/2007 | Yamazaki et al. ............... 438/29 |
| 2009/0213039 | A1 | | 8/2009 | Ito |

FOREIGN PATENT DOCUMENTS

| JP | 2008-112112 A | 5/2008 |
| KR | 10 2007-0059835 A | 6/2007 |
| KR | 10-2008-0052153 A | 6/2008 |

(Continued)

OTHER PUBLICATIONS

Korean Office Action in KR 10-2010-0030503, dated Mar. 7, 2012 (Yoon, et al.).

(Continued)

*Primary Examiner* — Kenneth Parker
*Assistant Examiner* — John Lin
(74) *Attorney, Agent, or Firm* — Lee & Morse, P.C.

(57) ABSTRACT

An organic light emitting display device includes a substrate having transmitting and pixel regions, the pixel regions being separated by the transmitting regions, at least one thin film transistor in each of the pixel regions, a plurality of transparent first conductive lines electrically connected to the thin film transistors and extending across the transmitting regions, a plurality of second conductive lines electrically connected to the thin film transistors and extending across the transmitting regions, a passivation layer, a plurality of pixel electrodes on the passivation layer, the pixel electrodes being separated and positioned to correspond to respective pixel regions, each of the pixel electrodes being electrically connected to and overlapping a corresponding thin film transistor, an opposite electrode overlapping the pixel electrodes in the transmitting and pixel regions, and an organic emission layer between the pixel electrodes and the opposite electrode.

16 Claims, 7 Drawing Sheets

(56) References Cited

FOREIGN PATENT DOCUMENTS

| KR | 10 2008-0095446 A | 10/2008 |
| KR | 10-2009-0075994 A | 7/2009 |
| KR | 10-0931584 B1 | 12/2009 |

OTHER PUBLICATIONS

KR Notice of Allowance dated Dec. 24, 2012.
Korean Office Action in KR 10-2010-0030503, dated Aug. 1, 2011 (Yoon, et al.).

* cited by examiner

ORGANIC LIGHT EMITTING DISPLAY DEVICE

BACKGROUND

1. Field

Example embodiments relate to an organic light emitting display device, and more particularly, to a transparent organic light emitting display device.

2. Description of the Related Art

Organic light emitting display devices generally have wide viewing angles, high contrast ratios, short response times, and reduced power consumption and, thus, may be used across a variety of applications, such as personal portable devices (e.g., MP3 players and mobile phones) or large screen displays (e.g., television sets). In addition, organic light emitting display devices have self-emitting characteristics and reduced weight and thickness, since organic light emitting display devices do not require an additional light source, unlike a liquid crystal display device.

For example, an organic light emitting display device may be manufactured as a transparent display device by including transparent thin film transistors and transparent organic light emitting devices. In a transparent display device, when the device is in an off-state, an object or an image positioned on a side of the device opposite to the user is transmitted to the user, e.g., through patterns of organic light emitting diodes, thin film transistors, various wires, and spaces between the patterns.

SUMMARY

Embodiments are therefore directed to an organic light emitting display device, which substantially overcomes one or more of the problems due to the limitations and disadvantages of the related art.

It is therefore a feature of an embodiment to provide a transparent organic light emitting display device having a high transmittance in transmitting regions.

It is therefore another feature of an embodiment to provide a transparent organic light emitting display device capable of preventing distortion of an image transmitted therethrough.

At least one of the above and other features and advantages may be realized by providing an organic light emitting display device, including a substrate having transmitting regions and pixel regions, the pixel regions being separated from each other by a corresponding transmitting region, at least one thin film transistor in each of the pixel regions on a first surface of the substrate, a plurality of first conductive lines electrically connected to the thin film transistors, the first conductive lines being transparent and extending across the transmitting regions, a plurality of second conductive lines electrically connected to the thin film transistors, the second conductive lines extending across the transmitting regions, a passivation layer covering the thin film transistors and the first and second conductive lines, a plurality of pixel electrodes on the passivation layer, the pixel electrodes being separated from each other and positioned to correspond to respective pixel regions, and each of the pixel electrodes being electrically connected to and overlapping a corresponding thin film transistor, an opposite electrode overlapping the plurality of pixel electrodes, the opposite electrode being configured to transmit light and overlap the transmitting regions and the pixel regions, and an organic emission layer between the pixel electrodes and the opposite electrode, the organic emission layer being configured to emit light.

Each of the pixel electrodes may have an area substantially identical to that of a corresponding pixel region.

At least one of the first conductive lines and the second conductive lines may be arranged to overlap a respective pixel electrode.

A ratio of a total area of the transmitting region with respect to a total area of the pixel regions and the transmitting region may be between about 5% and about 90%.

The passivation layer may be transparent.

The second conductive lines may be transparent.

The second conductive lines may be opaque.

A width of the first conductive lines may be larger than a width of the second conductive lines.

The pixel electrodes may be reflection electrodes.

At least one of the above and other features and advantages may also be realized by providing an organic light emitting display device, including a substrate having transmitting regions and pixel regions, the pixel regions being separated from each other by a corresponding transmitting region, a plurality of pixel circuit units in respective pixel regions on the substrate, each of the pixel circuit units including at least one thin film transistor, a plurality of first conductive lines electrically connected to the plurality of pixel circuit units, the first conductive lines being transparent and extending across the transmitting regions, a plurality of second conductive lines electrically connected to the pixel circuit units, the second conductive lines extending across the transmitting regions, a first insulation layer covering the plurality of pixel circuit units and the first and second conductive lines, the first insulation layer being positioned in the transmitting regions and pixel regions, a plurality of pixel electrodes on the first insulation layer, the pixel electrodes being separated from each other and positioned to correspond to respective pixel circuit units, and each of the pixel electrodes being electrically connected to and overlapping a corresponding thin film transistor, and an opposite electrode overlapping the plurality of pixel electrodes, the opposite electrode being configured to transmit light and overlap the transmitting regions and pixel regions.

The pixel electrodes may be formed in each of the pixel regions.

At least one of the first conductive lines and the second conductive lines may be formed to pass through the pixel regions.

A ratio of a total area of the transmitting region with respect to a total area of the pixel regions and the transmitting region may be between about 5% and about 90%.

The first insulating layer may be formed of a transparent material.

The second conductive lines may be formed of a transparent conductor.

The second conductive lines may be formed of an opaque conductor.

A width of the first conductive lines may be larger than a width of the second conductive lines.

The pixel electrodes may be reflection electrodes.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0030503, filed on Apr. 2, 2010, in the Korean Intellectual Property Office, and entitled: "Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
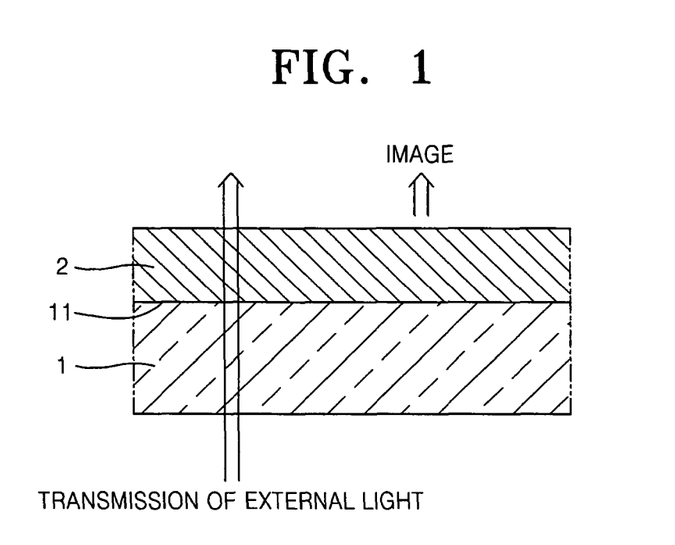
FIG. 1 illustrates a schematic cross-sectional view of an organic light emitting display device according to an embodiment.

FIG. 1 illustrates a cross-sectional view of an organic light emitting display device according to an embodiment. Referring to FIG. 1, in the organic light emitting display device according to an embodiment, a display unit 2 may be disposed on a first surface 11 of a substrate 1. In the organic light emitting display device according to the current embodiment, external light is transmitted through the substrate 1 and the display unit 2.

As will be described later, the display unit 2 is formed to transmit external light. For example, referring to FIG. 1, the display unit 2 is formed in such a way that a user positioned on a side where an image is displayed, i.e., facing a surface of the display unit 2 that faces away from the substrate 1, may also observe external images transmitted through the substrate 1 and the display unit 2, i.e., images behind the substrate 1.

Figure 2:
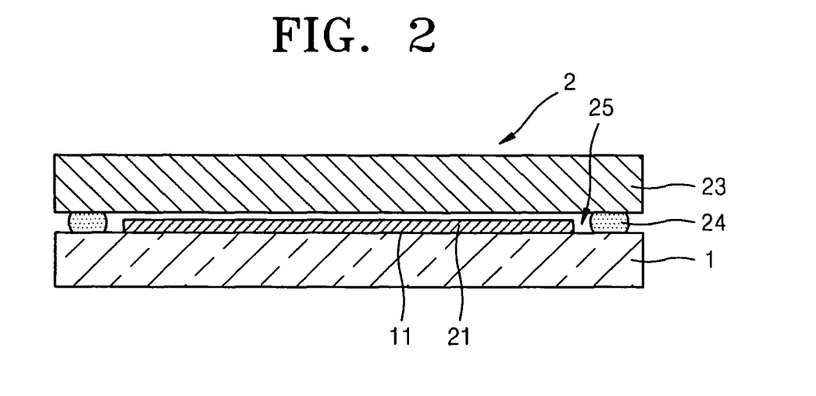
FIG. 2 illustrates a detailed cross-sectional view of an embodiment of the organic light emitting display device of FIG. 1.

FIG. 2 illustrates a detailed cross-sectional view of an embodiment of the organic light emitting display device of FIG. 1. Referring to FIG. 2, the display unit 2 may include an organic emission unit 21 disposed on the first surface 11 of the substrate 1 and a sealing substrate 23 to seal the organic emission unit 21. The sealing substrate 23 may be formed of a transparent material to allow viewing of an image generated by the organic emission unit 21 and to prevent external air and moisture from penetrating into the organic emission unit 21.

Edges of the substrate 1 and the sealing substrate 23 may be coupled to each other using a sealing member 24, thereby defining a sealed space 25 between the substrate 1 and the sealing substrate 23. The sealed space 25 may be filled with an absorbent or a filler.

Figure 3:
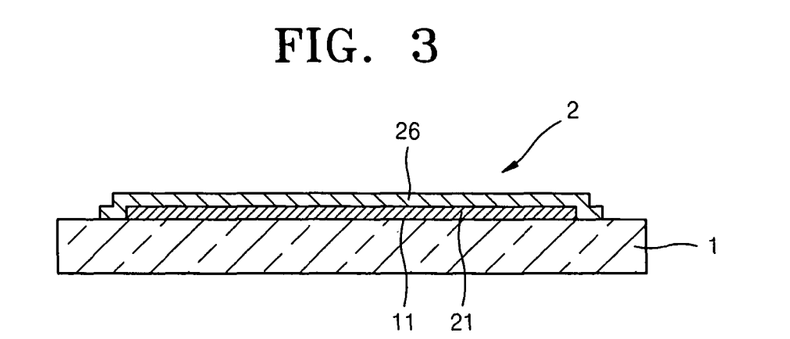
FIG. 3 illustrates a detailed cross-sectional view of another embodiment of the organic light emitting display device of FIG. 1.

FIG. 3 illustrates a detailed cross-sectional view of another embodiment of the organic light emitting display device of FIG. 1. As shown in FIG. 3, a thin sealing film 26 may be formed on the organic emission unit 21 to protect the organic emission unit 21 from the environment. The thin sealing film 26 may have a structure in which a film formed of an inorganic material, e.g., silicon oxide or silicon nitride, and a film formed of an organic material, e.g., epoxy or polyimide, are alternately stacked. The thin sealing film 26 may have any thin film type sealing structure.

Figure 4:
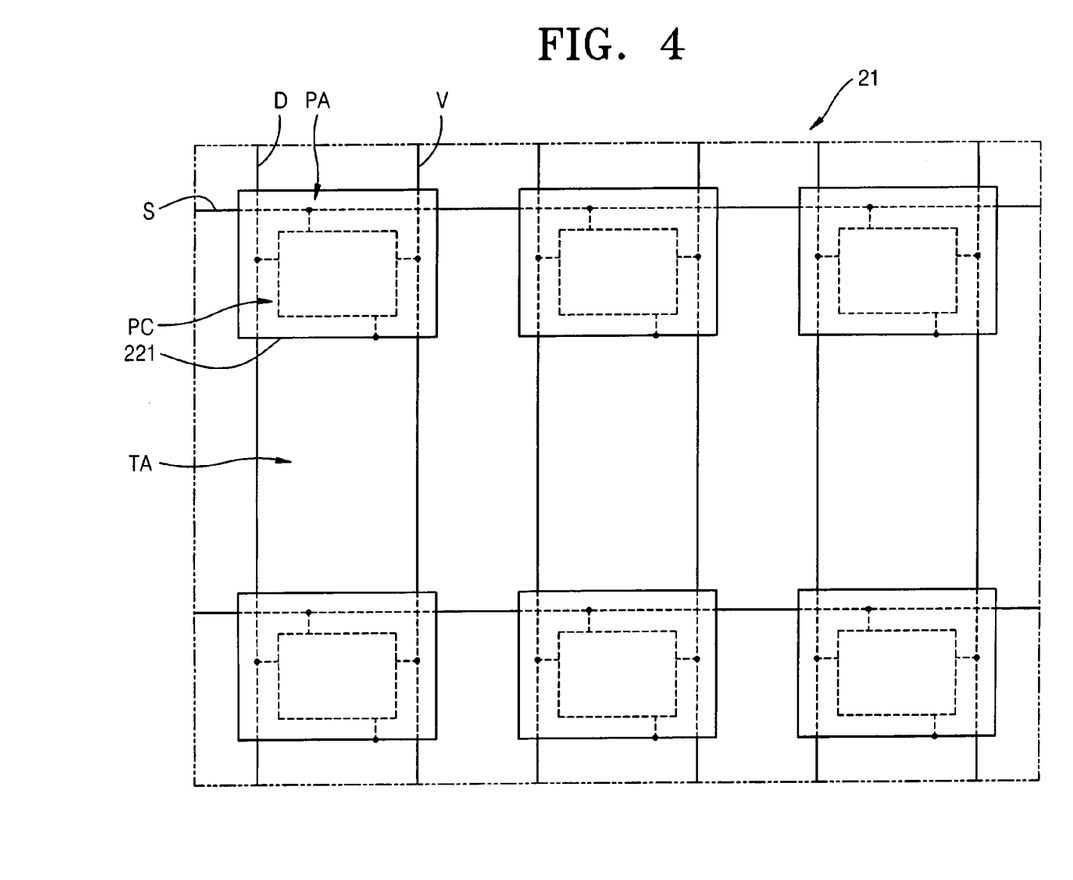
FIG. 4 illustrates a schematic drawing of an organic emission unit according to an embodiment.
Figure 5:
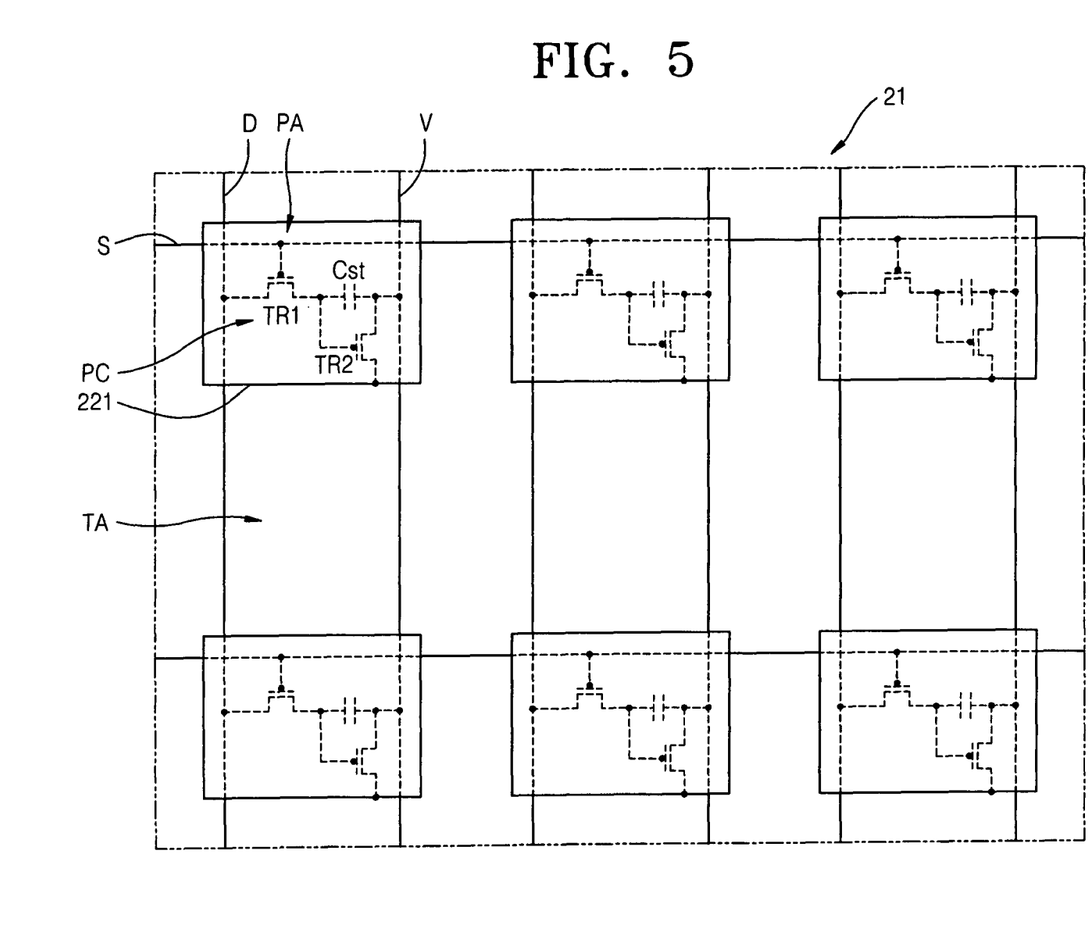
FIG. 5 illustrates a schematic drawing of a pixel circuit unit in the organic emission unit of FIG. 4.

FIG. 4 illustrates a schematic view of the organic emission unit 21, and FIG. 5 illustrates a schematic view of a pixel circuit unit PC of FIG. 4. Referring to FIGS. 2 through 5, the organic emission unit 21 according to an embodiment may be disposed on the substrate 1, in which a transmitting region TA for transmitting external light and pixel regions PA separated from each other with the transmitting region TA interposed therebetween are defined. For example, one transmitting region TA may extend to separate a plurality of pixel regions PA. In another example, a plurality of transmitting regions TA may be arranged to separate a plurality of pixel regions PA.

In detail, referring to FIG. 4, each of the pixel regions PA may include a pixel circuit unit PC and a plurality of conductive lines, e.g., a scan line S, a data line D, and a Vdd line V, electrically connected to the pixel circuit unit PC. Although not shown, various other conductive lines besides the scan line S, the data line D, and the Vdd line V may further be connected to the pixel circuit unit PC according to the configuration of the pixel circuit unit PC.

Referring to FIG. 5, the pixel circuit unit PC may include a first thin film transistor TR1 connected to the scan line S and the data line D, a second thin film transistor TR2 connected to the first thin film transistor TR1 and the Vdd line V, and a capacitor Cst connected to the first and second thin film transistors TR1 and TR2. For example, the first thin film transistor TR1 may be a switching transistor and the second thin film transistor TR2 may be a driving transistor. The second thin film transistor TR2 is electrically connected to a pixel electrode 221. In FIG. 5, the first and second thin film transistors TR1 and TR2 are P-type transistors, but are not limited thereto, and at least one of the first and second thin film transistors TR1 and TR2 may be an N-type transistor. The number of the thin film transistors or capacitors as described above is not limited thereto, and two or more thin film transistors and one or more capacitors may be included.

According to the current embodiment, at least one of the scan line S, the data line D, and the Vdd line V may be disposed across the pixel regions PA. For example, as illustrated in FIGS. 4-5, all of the scan line S, the data line D, and the Vdd line V may be disposed across the pixel regions PA.

The pixel regions PA are light emitting regions configured to display an image. Since the pixel circuit units PC are located in the light emitting regions and the conductive lines cross the light emitting regions, the user may only recognize the light emitting regions and can see an outside view through the transmitting region TA. In other words, since most of the conductive patterns, e.g., scan line S, the data line D, and the Vdd line V, are arranged to pass through the pixel regions PA, only small portions of the conductive patterns may pass through the transmitting region TA. Therefore, a surface area of the conductive patterns that is not transparent, i.e., a factor affecting transmittance, in the transmitting region TA according to example embodiments may be minimized. Accordingly, the transmittance of the transmitting region TA may be increased. As described above, as most of the conductive patterns are disposed in the pixel region PA, transmittance of the transmitting region TA and the whole transmittance of the organic emission unit 21 may be increased, as compared to a conventional transparent display device.

It is noted that as the pixel regions PA and the transmitting region TA are separated, when seeing an external image transmitted through the transmitting regions TA, distortion of the external image generated due to diffusion of external light in relation to patterns of devices in the pixel circuit unit PC may be prevented. Thus, scattering of external light, e.g., solar light, due to light interference with patterns of internal devices of the pixel circuit unit PC may be minimized, thereby preventing external image distortion.

In one embodiment, at least one of the conductive lines including scan line S, data line D, and Vdd line V may be disposed to cross the transmitting region TA between the pixel regions PA. However, since the conductive lines according to example embodiments are formed to be very thin, the conductive lines can hardly be observed by the user and have little effect on the overall transmittance of the organic emission unit 21. Accordingly, a transparent display can be realized. Also, although the user may not see the external image as much in regions covered by the pixel regions PA, in consideration of the overall display region, there is little effect on observing the external image since the pixel regions PA are like a plurality of dots regularly arranged on a surface of a transparent glass.

For example, the transmitting region TA and the pixel regions PA may be formed in such a way that a ratio of the area of the transmitting region TA with respect to the overall area of the transmitting region TA and the pixel regions PA is between about 5% and about 90%. The above ratio range may provide an optimal balance between the prevention of light scattering and pixel integrity for providing a stable image.

If the ratio of the area of the transmitting region TA with respect to the overall area of the transmitting region TA and the pixel regions PA is less than 5%, the user can hardly see an object or image on a side opposite to the user due to lack of light that can transmit through the display unit 2 when the display 2 unit is in an off-state. That is, the display unit 2 is not a transparent device. If the ratio of the area of the transmitting region TA with respect to the overall area of the transmitting region TA and the pixel regions PA is about 5% or higher, the pixel regions PA are present in an island state with respect to the transmitting region TA, and scattering of light is minimized since all conductive patterns are disposed across the pixel regions PA, and thus, the display unit 2 may be recognized as a transparent display unit by the user. As will be described later, when a transistor included in the pixel circuit unit PC is formed of a transparent thin film transistor, e.g., an oxide semiconductor, and an organic light emitting device is a transparent device, the display unit 2 may further be recognized as a transparent display unit.

If the ratio of the area of the transmitting regions TA with respect to the entire area of the pixel regions PA and the transmitting regions TA is greater than 90%, pixel integrity of the display unit 2 is excessively reduced, and thus, a stable image may not be realized through the light emission from the pixel regions PA. That is, as the area of the pixel regions PA is reduced, the amount of light emitted from an organic emission layer 223, which will be described later, must be increased in order to realize an image. However, if the organic light emitting device is operated so as to emit light having a high intensity, the lifetime of the organic light emitting device is rapidly reduced. Also, when the ratio of the area of the transmitting regions TA with respect to the entire area of the pixel regions PA and the transmitting regions TA is greater than 90% while the size of a single pixel region PA is maintained at an appropriate size, the number of pixel regions PA is reduced, and accordingly, the resolution of the organic light emitting device is reduced.

For example, the ratio of the area of the transmitting region TA with respect to the entire area of the pixel regions PA and the transmitting region TA may be in a range of about 20% to about 0% in order to enhance transparency of the device. This ratio range (about 20% to about 70%) may provide certain advantages. For example, a ratio range of about 20% or higher may not significantly limit the user's capability of observing an external image through the transmitting region TA. Further, a ratio range of about 70% or less may make it easier to design the pixel circuit unit PC. However, in other embodiments, ratio ranges other than the above-described ranges can be used.

Figure 6:
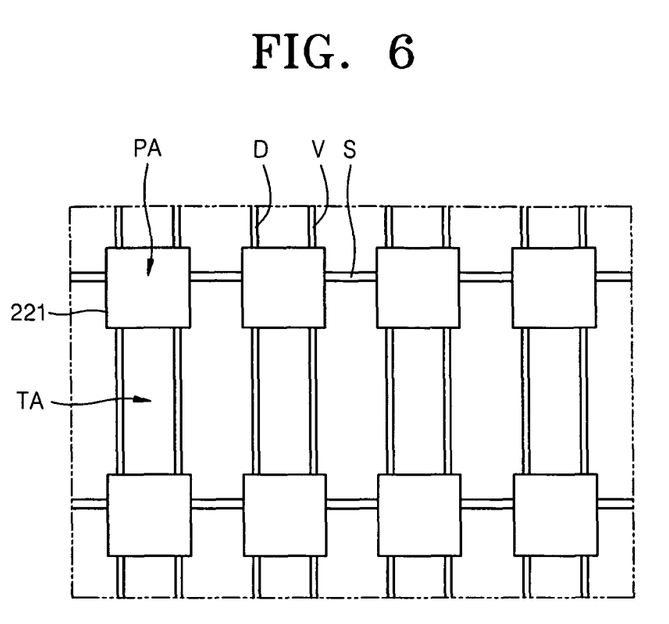
FIG. 6 illustrates a schematic plan view of the organic emission unit of FIG. 5.

Each of the pixel regions PA may include a pixel electrode 221 that is electrically connected to the pixel circuit unit PC. The pixel circuit unit PC may overlap the pixel electrode 221, so that the pixel circuit unit PC can be covered by the pixel electrode 221. Also, the conductive lines including the scan line S, the data line D, and the Vdd line V, may be disposed to cross the pixel electrode 221. For example, as illustrated in FIGS. 5 and 6, the pixel electrode 221 may have an area substantially identical, i.e., in terms of size and shape, to that of the pixel region PA. In another example, the pixel electrode 221 may be slightly larger than the pixel region PA. Accordingly, as shown in FIG. 6, when the user observes the organic emission unit 21, the pixel circuit unit PC described above is covered by the pixel electrode 221 and a large portion of the conductive lines are also covered. In other words, when the user observes the organic emission unit 21, the user sees only the pixel electrode 221. Therefore, scattering of light due to small spaces between patterns in the pixel circuit unit PC is greatly reduced. Further, the user sees a portion of the conductive lines through the transmitting regions TA, and thus the total transmittance of the display device may be increased and the user can observe an undistorted external image.

Figure 7:
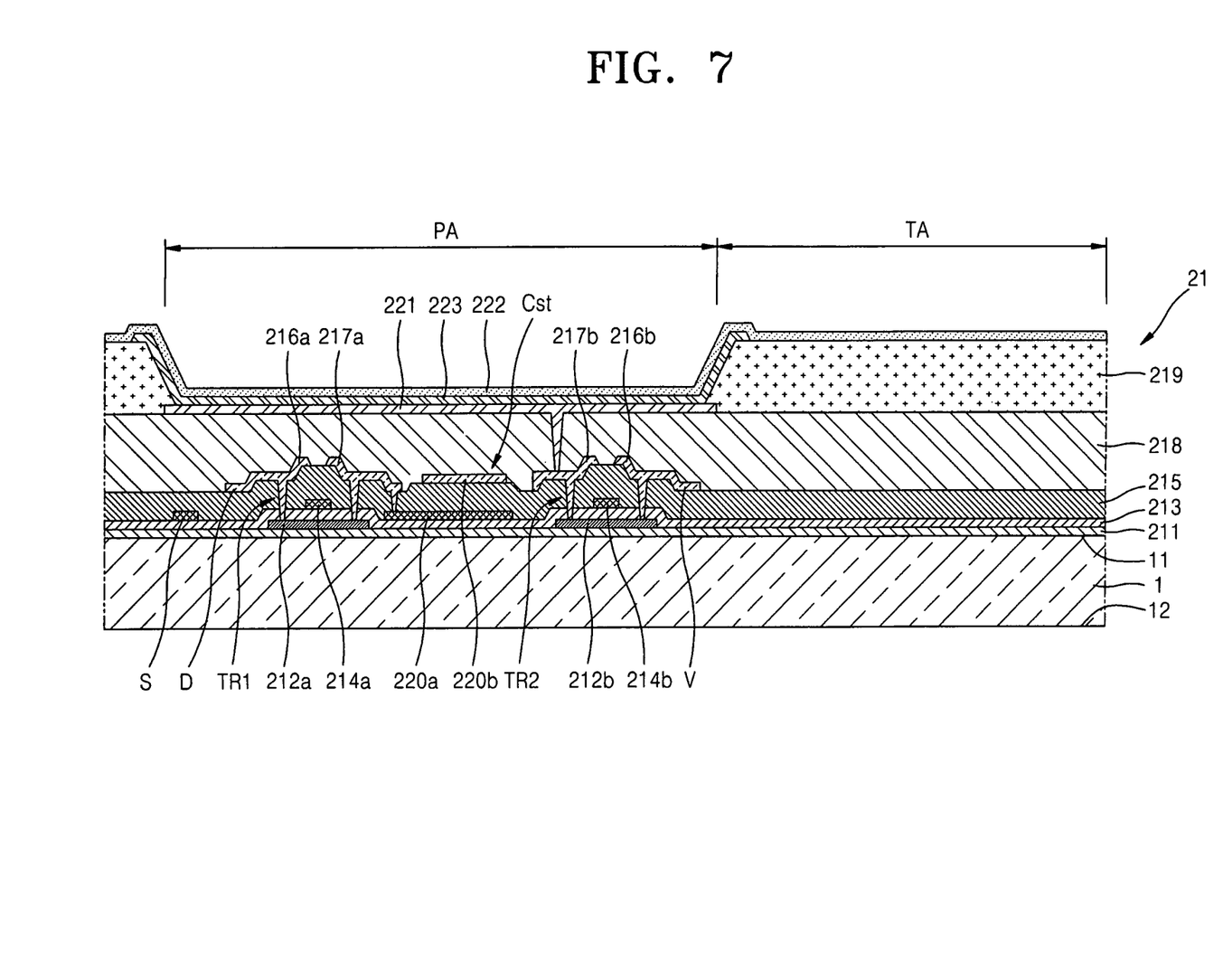
FIG. 7 illustrates a cross-sectional view of the organic emission unit of FIG. 5.

FIG. 7 illustrates a detailed cross-sectional view of the organic emission unit 21 and the pixel circuit unit PC. Referring to FIG. 7, the organic emission unit 21 may include a buffer layer 211 on the first surface 11 of the substrate 1, and a first thin film transistor (TFT) TR1, a capacitor Cst, and a second TFT TR2 on the buffer layer 211.

The buffer layer 211 prevents impurity elements from penetrating into the organic emission unit 21 and planarizes the first surface 11 of the substrate 1. The buffer layer 211 may be formed of any of various materials that can perform the functions described above. For example, the buffer layer 211 may be formed of an inorganic material, e.g., silicon oxide, silicon nitride, silicon oxynitride, aluminum oxide, aluminum nitride, titanium oxide, or titanium nitride, an organic material, e.g., polyimide, polyester, or acryl, or stacks of these materials. In some embodiments, the buffer layer 211 may be omitted.

Next, a first semiconductor active layer 212a and a second semiconductor active layer 212b may be formed on the buffer layer 211. The first and second semiconductor active layers 212a and 212b may be formed of polycrystalline silicon, but are not limited thereto, and may be formed of a semiconductor oxide, e.g., a G-I—Z—O layer [$(In_2O_3)a(Ga_2O_3)b(ZnO)c$ layer], wherein a, b, and c are integers that respectively satisfy a≥0, b≥0, and c>0. When the first and second semiconductor active layers 212a and 212b are formed of a semiconductor oxide, optical transmittance may further be increased.

A gate insulation layer 213 covering the first and second semiconductor active layers 212a and 212b may be formed on the buffer layer 211, and first and second gate electrodes 214a and 214b may be formed on the gate insulation layer 213. An interlayer insulation layer 215 may be formed on the gate insulation layer 213 to cover the first and second gate electrodes 214a and 214b. A first source electrode 216a, a first drain electrode 217a, a second source electrode 216b, and a second drain electrode 217b may each be formed on the interlayer insulation layer 215, and may be respectively connected to the first semiconductor active layer 212a and the second semiconductor active layer 212b through contact holes.

In FIG. 7, the scan line S may be substantially simultaneously formed with the first and second gate electrodes 214a and 214b. The data line D may be substantially simultaneously formed with the first source electrode 216a and connected to the first source electrode 216a. The Vdd line V may be substantially simultaneously formed with the second source electrode 216b and connected to the second source electrode 216b.

In the capacitor Cst, a lower electrode 220a may be substantially simultaneously formed with the first and second gate electrodes 214a and 214b. An upper electrode 220b may be substantially simultaneously formed with the first drain electrode 217a.

The structures of the first TFT TR1, the capacitor Cst, and the second TFT TR2 are not limited thereto, and any of various types of TFT and capacitor structures can be employed. For example, the first TFT TR1 and the second TFT TR2 may be of a top gate structure, and the first gate electrode 214a and the second gate electrode 214b may be formed of a bottom gate structure disposed under the first semiconductor active layer 212a and the second semiconductor active layer 212b. Also, the first TFT TR1 and the second TFT TR2 may have any of various types of TFT structures.

A passivation layer 218 may be formed to cover the first TFT TR1, the capacitor Cst, and the second TFT TR2. The passivation layer 218 may be a single layer or multiple layers of insulation layer, an upper surface of which is planarized. The passivation layer 218 may be formed of an inorganic material and/or an organic material.

Referring to FIG. 7, a pixel electrode 221 covering the first TFT TR1, the capacitor Cst, and the second TFT TR2 may be formed on the passivation layer 218. The pixel electrode 221 may be connected to the second drain electrode 217b of the second TFT TR2 through a via hole formed in the passivation layer 218. In one embodiment, as shown in FIG. 6, the pixel electrode 221 is formed to have an island shape, e.g., separate and independent from adjacent pixel electrodes 221. For example, as further illustrated in FIG. 7, the pixel electrode 221 may extend to completely overlap the transistors TR1 and TR2, as well as the conductive lines S, D, and V.

A pixel defining layer 219 covering edges of the pixel electrode 221 may be formed on the passivation layer 218. An organic emission layer 223 and an opposite electrode 222 may be sequentially formed on the pixel electrode 221. The opposite electrode 222 may be formed, e.g., continuously, on all the pixel regions PA and the transmitting regions TA.

The organic emission layer 223 may be a low molecular weight organic layer or a polymer organic layer having a large molecular weight. When the organic emission layer 223 is a low molecular weight organic layer, the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. In this regard, the HIL, the HTL, the ETL, and the EIL are common layers and may be commonly applied to red, green, and blue pixels. Accordingly, unlike the EML, the common layers may be formed to cover the pixel regions PA and the transmitting regions TA like the opposite electrode 222.

In one embodiment, the pixel electrode 221 functions as an anode electrode, and the opposite electrode 222 functions as a cathode electrode. Alternatively, the polarities of the pixel electrode 221 and the opposite electrode 222 may be reversed.

As discussed previously, the pixel electrode 221 has a size corresponding to each of the pixels of the pixel regions PA. That is, a portion of the pixel electrode 221, except a portion covered by the pixel defining layer 219, corresponds to the pixel region PA or is a little bit larger than the pixel regions PA. Also, the opposite electrode 222 may be a common electrode covering all pixels of the whole organic emission unit 21.

According to an embodiment, the pixel electrode 221 may be a reflection electrode and the opposite electrode 222 may be a transparent electrode. Accordingly, the organic emission unit 21 is a top emission type in which an image is displayed towards the opposite electrode 222.

The pixel electrode 221 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function, e.g., ITO, IZO, ZnO, and/or $In_2O_3$. The opposite electrode 222 may be formed of a metal having a low work function, e.g., Ag, Mg, Al, Pt, Pd, Au, Ni, Nd, Ir, Cr, Li, Ca, and/or an alloy thereof. The opposite electrode 222 may be formed of a thin film so as to increase the transmittance thereof.

When the pixel electrode 221 is a reflection electrode, a pixel circuit unit disposed under the pixel electrode 221 may be covered by the pixel electrode 221, e.g., the pixel electrode 221 may completely overlap the pixel circuit unit PC. Therefore, referring to FIG. 7, a user observing from an upper outer side of the opposite electrode 222 may not see the first TFT TR1, the capacitor Cst, and the second TFT TR2 disposed under the pixel electrode 221, as well as portions of the scan line S, the data line D, and the Vdd line V.

When the pixel electrode 221 is reflective, light is emitted only towards the user. Thus, the amount of light that can be lost in a direction opposite to the user may be reduced. Also, since the pixel electrode 221 covers various patterns of the pixel circuit unit PC disposed under the pixel electrode 221, as described above, the user can see a clearer external image or object.

Example embodiments are not limited thereto. For example, the pixel electrode 221 may also be a transparent electrode or a semi-transparent electrode. In this case, the pixel electrode 221 may be formed of an oxide having a high work function, e.g., ITO, IZO, ZnO, and/or $In_2O_3$, without including the reflection layer. If the pixel electrode 221 is transparent, a user observing from an upper outer side of the opposite electrode 222 may see the first TFT TR1, the capacitor Cst, and the second TFT TR2 disposed under the pixel electrode 221, as well as portions of the scan line S, the data line D, and the Vdd line V. However, although the pixel electrode 221 is transparent, there is some loss of light, e.g., since transmittance of light therethrough cannot be 100%, and the transmittance of external light is further reduced due to the conductive patterns disposed in the region of the pixel electrode 221. Therefore, external light interference due to the conductive patterns may be reduced, e.g., as compared to external light directly entering the conductive patterns, thereby reducing distortion of an external image.

The passivation layer 218, the gate insulation layer 213, the interlayer insulation layer 215, and the pixel defining layer 219 may be formed as transparent insulation layers. In one embodiment, the substrate 1 may have a transmittance less than or equal to the total transmittance of the transparent insulation layers.

Referring back to FIG. 6, at least one of the conductive lines, e.g., one of the data line D, the scan line S, and the Vdd line V, may be formed of a transparent conductor. Examples of the transparent conductor may include ITO, IZO, ZnO, and/or $In_2O_3$. The conductive lines formed of a transparent conductor may be disposed across the transmitting regions TA, and thus, the total transmittance of the transmitting regions TA may be increased. As such, low transmittance and image distortion due to interference of external light may be reduced.

For example, referring to FIG. 6, all of the conductive lines, e.g., the data line D, the scan line S, and the Vdd line V, may be formed of a transparent conductor. Conductive lines not formed of a transparent conductor may be formed of an opaque conductor, e.g., a metal. Examples of opaque conductors may include Ag, Mg, Al, Pt, Pd, Au, Ni, Nd, Ir, Cr, Li, Ca, and/or alloys thereof.

Figure 8:
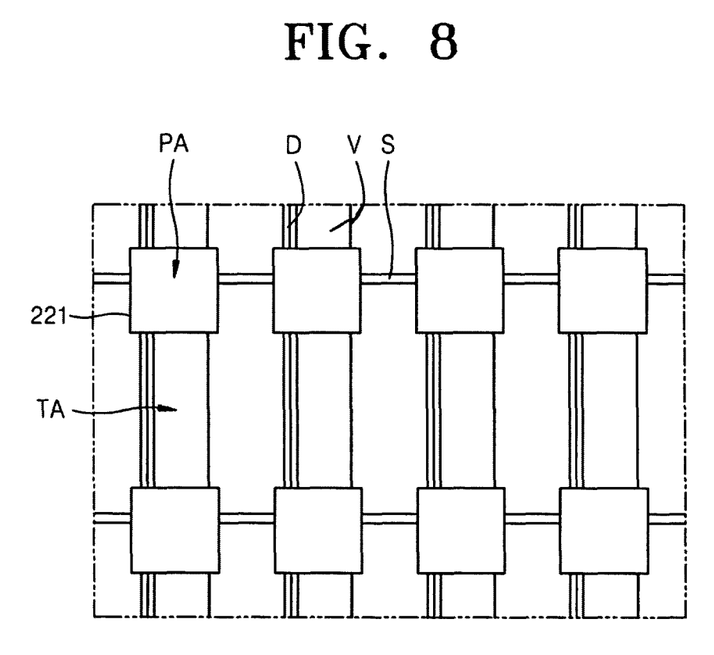
FIG. 8 illustrates a schematic plan view of an organic emission unit according to another embodiment.

FIG. 8 illustrates a plan view of an organic emission unit according to another example. For example, referring to FIG. 8, the Vdd line V may be formed of a transparent conductor, and the data line D and scan line S may be formed of an opaque conductor.

Referring to FIG. 8, a width of the Vdd line V formed of a transparent conductor may be larger than widths of the data line D and the scan line S formed of the opaque conductor. For example, as illustrated I FIG. 8, the width of the Vdd line V may be larger than ½ a width of the pixel region PA. Accordingly, a voltage drop of the Vdd line V may be reduced. Also, as the Vdd line V has a large width, formation of multiple slits in the transmitting region TA, e.g., due to a plurality of wirings, may be prevented, thereby minimizing image distortion due to diffraction of light transmitted through multiple slits. This, in turn, increases the transmittance.

Figure 9:
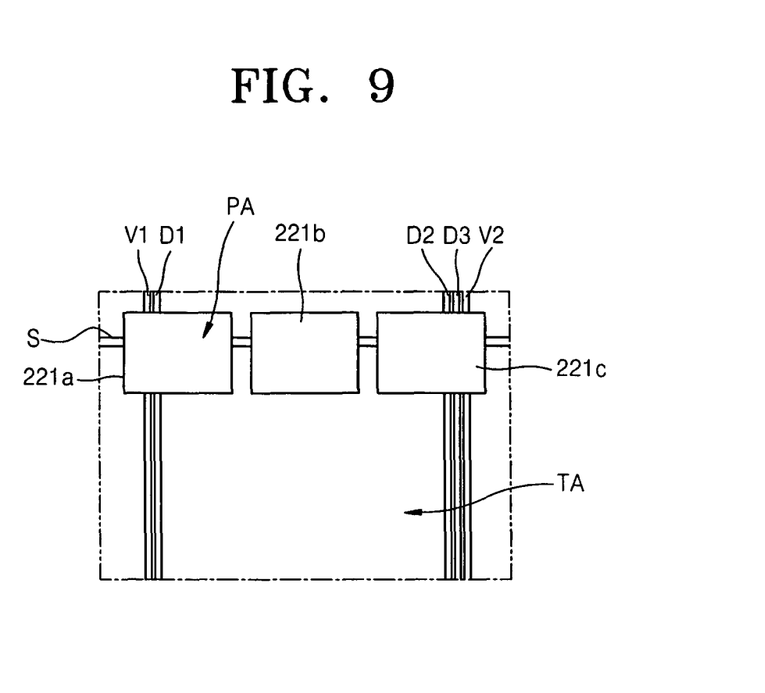
FIG. 9 illustrates a schematic plan view of an organic emission unit according to another embodiment.

FIG. 9 illustrates a plan view of an organic emission unit according to another embodiment. Referring to FIG. 9, one transmitting region TA may be formed to correspond to a first pixel electrode 221a, a second pixel electrode 221b, and a third pixel electrode 221c. First through third data lines D1 through D3 may be electrically connected to first through third pixel electrodes 221a through 221c. Also, a first Vdd line V1 may be electrically connected to the first pixel electrode 221a and the second pixel electrode 221b, and a second Vdd line V2 may be electrically connected to the third pixel electrode 221c. For example, the first through third data lines D1 through D3, as well as the first and second Vdd lines V1 and V2, may be arranged along edges of the first or third pixel electrodes 221a and 221c, so no lines may cross a center of the transmitting region TA.

In the above-described configuration, since one large transmitting region TA is formed to correspond to three pixel electrodes, e.g., corresponding to red (R), green (G), and blue (B) sub-pixels, transmittance may be further increased, and image distortion due to light diffusion may be further reduced. Also, in this configuration, at least one of the first through third data lines D1 through D3, the scan line S, the first Vdd line V1, and the second Vdd line V2 may be formed of a transparent conductor, and accordingly, image distortion may be reduced and the transmittance may be increased.

Figure 10:
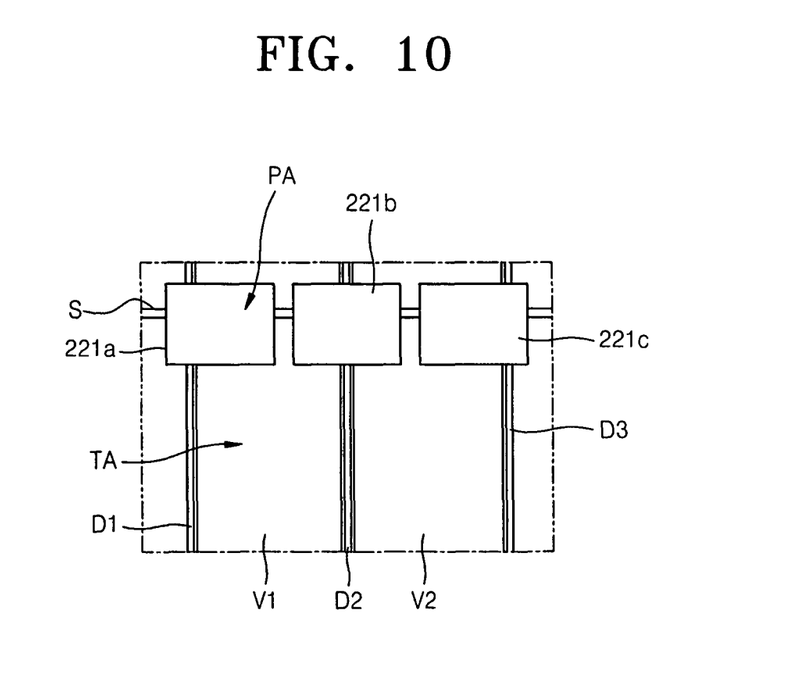
FIG. 10 illustrates a schematic plan view of an organic emission unit according to another embodiment.

FIG. 10 illustrates a plan view of an organic emission unit according to another embodiment. Referring to FIG. 10, the first Vdd line V1 and the second Vdd line V2 may be formed of a transparent conductor, and first through third data lines D1 through D3 and the scan line S may be formed of an opaque conductor. As illustrated in FIG. 10, the first Vdd line V1 and the second Vdd line V2 may be formed to have larger widths than the first through third data lines D1 through D3 or the scan line S, so as to compensate for an increase in resistance due to the transparent conductor.

According to an embodiment, a transparent organic light emitting display device may include pixel electrodes and conductive lines arranged to have improved transmittance in a transmitting area, thereby increasing transmittance with respect to external light. Also, the arrangement of the conductive lines may be capable of preventing distortion of an image transmitted therethrough by preventing diffusion of transmitted light.

In contrast, conductive lines, i.e., patterns, in a conventional transparent organic light emitting device may not have a high transmittance and may have small spaces therebetween. For example, the spaces may be only a few nanometers wide, i.e., almost equal to the wavelengths of visible light, thereby causing light to scatter as it passes through. Thus, transmittance of the entire conventional transparent display device may be reduced and a distorted image may be transmitted to the user due to the conductive lines of the conventional organic light emitting display.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
   a substrate having transmitting regions and pixel regions, the pixel regions being separated from each other by a corresponding transmitting region;
   at least one thin film transistor in each of the pixel regions on the substrate;
   a plurality of first conductive lines electrically connected to the thin film transistors, the first conductive lines being transparent and extending across the transmitting regions;
   a plurality of second conductive lines electrically connected to the thin film transistors, the second conductive lines extending across the transmitting regions;
   a passivation layer covering the thin film transistors and the first and second conductive lines;
   a plurality of pixel electrodes on the passivation layer, the pixel electrodes being separated from each other and positioned to correspond to respective pixel regions, and each of the pixel electrodes being electrically connected to and overlapping a corresponding thin film transistor;
   an opposite electrode overlapping the plurality of pixel electrodes, the opposite electrode being configured to transmit light and overlap the transmitting regions and the pixel regions; and an organic emission layer between the pixel electrodes and the opposite electrode, the organic emission layer being configured to emit light, wherein the transmitting regions are substantially transparent, the transmitting regions being configured to transmit external light therethrough, and wherein all layers and electrodes on the transmitting region of the substrate are configured to substantially transmit external light.

2. The organic light emitting display device as claimed in claim 1, wherein an area of each pixel electrode is substantially identical to that of a corresponding pixel region, each pixel electrode overlapping the entire corresponding thin film transistor.

3. The organic light emitting display device as claimed in claim 1, wherein at least one of the first conductive lines and the second conductive lines overlaps a respective pixel electrode, each thin film transistor being directly connected to a corresponding first conductive line and a corresponding second conductive line.

4. The organic light emitting display device as claimed in claim 1, wherein a ratio of a total area of the transmitting regions with respect to a total area of the pixel regions and transmitting regions is about 5% to about 90%.

5. The organic light emitting display device as claimed in claim 2, wherein the passivation layer is transparent, and each pixel electrode further overlaps corresponding first and second conductive lines.

6. The organic light emitting display device as claimed in claim 1, wherein the second conductive lines are transparent.

7. The organic light emitting display device as claimed in claim 1, wherein a width of the first conductive lines is larger than a width of the second conductive lines.

8. The organic light emitting display device as claimed in claim 1, wherein the pixel electrodes are reflection electrodes.

9. An organic light emitting display device, comprising:
a substrate having transmitting regions and pixel regions, the pixel regions being separated from each other by a corresponding transmitting region;
a plurality of pixel circuit units in respective pixel regions on the substrate, each of the pixel circuit units including at least one thin film transistor;
a plurality of first conductive lines electrically connected to the plurality of pixel circuit units, the first conductive lines being transparent and extending across the transmitting regions;
a plurality of second conductive lines electrically connected to the pixel circuit units, the second conductive lines extending across the transmitting regions;
a first insulation layer covering the plurality of pixel circuit units and the first and second conductive lines, the first insulation layer being positioned in the transmitting regions and pixel regions;
a plurality of pixel electrodes on the first insulation layer, the pixel electrodes being separated from each other and positioned to correspond to respective pixel circuit units, and each of the pixel electrodes being electrically connected to and overlapping a corresponding thin film transistor; and
an opposite electrode overlapping the plurality of pixel electrodes, the opposite electrode being configured to transmit light and overlap the transmitting regions and pixel regions, wherein the transmitting regions are substantially transparent, the transmitting regions being configured to transmit external light therethrough, and wherein all layers and electrodes on the transmitting region of the substrate are configured to substantially transmit external light.

10. The organic light emitting display device as claimed in claim 9, wherein the pixel electrodes are in each of the pixel regions.

11. The organic light emitting display device as claimed in claim 9, wherein at least one of the first conductive lines and the second conductive lines passes through the pixel regions.

12. The organic light emitting display device as claimed in claim 9, wherein a ratio of a total area of the transmitting regions with respect to a total area of the pixel regions and transmitting regions is about 5% to about 90%.

13. The organic light emitting display device as claimed in claim 9, wherein the first insulating layer is transparent.

14. The organic light emitting display device as claimed in claim 9, wherein the second conductive lines are transparent.

15. The organic light emitting display device as claimed in claim 9, wherein a width of the first conductive lines is larger than a width of the second conductive lines.

16. The organic light emitting display device as claimed in claim 9, wherein the pixel electrodes are reflection electrodes.

* * * * *